United States Patent
Lee et al.

(10) Patent No.: US 6,696,747 B1
(45) Date of Patent: Feb. 24, 2004

(54) SEMICONDUCTOR PACKAGE HAVING REDUCED THICKNESS

(75) Inventors: Tae Heon Lee, Kuri-shi (KR); Mu Hwan Seo, Aspen Heights (SG)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/687,585

(22) Filed: Oct. 13, 2000

(Under 37 CFR 1.47)

(30) Foreign Application Priority Data

Oct. 15, 1999 (KR) .......................... 1999-44651

(51) Int. Cl.[7] ................ H01L 23/495; H01L 23/043; H01L 21/44; H01L 21/48; H01L 21/50; H01R 43/00

(52) U.S. Cl. ............ 257/666; 257/708; 438/111; 438/123; 29/827

(58) Field of Search ............... 257/787, 666, 257/708; 438/112, 127, 111, 123; 29/827

(56) References Cited

U.S. PATENT DOCUMENTS

| | | | |
|---|---|---|---|
| 4,530,152 A | 7/1985 | Roche et al. | 29/588 |
| 5,041,902 A | 8/1991 | McShane | 357/79 |
| 5,157,480 A | 10/1992 | McShane et al. | 357/74 |
| 5,172,213 A | 12/1992 | Zimmerman | 257/796 |
| 5,172,214 A | 12/1992 | Casto | 257/676 |
| 5,278,446 A | 1/1994 | Nagaraj et al. | 257/707 |
| 5,428,248 A | 6/1995 | Cha | 257/676 |
| 5,454,905 A * | 10/1995 | Fogelson | 156/651.1 |
| 5,521,429 A | 5/1996 | Aono et al. | 257/676 |
| 5,701,034 A | 12/1997 | Marrs | 257/706 |
| 5,783,861 A | 7/1998 | Son | 253/693 |
| 5,835,988 A | 11/1998 | Ishii | 257/684 |
| 5,859,471 A * | 1/1999 | Kuraishi et al. | 257/666 |
| 5,866,939 A | 2/1999 | Shin et al. | 257/666 |
| 5,886,397 A * | 3/1999 | Ewer | 257/667 |

(List continued on next page.)

FOREIGN PATENT DOCUMENTS

| | | |
|---|---|---|
| JP | 57-45959 | 3/1982 |
| JP | 58-101317 | 6/1983 |
| JP | 58-160095 | 9/1983 |
| JP | 61-39555 | 2/1986 |
| JP | 62-9639 | 1/1987 |
| JP | 63-205935 | 8/1988 |
| JP | 63-233555 | 9/1988 |
| JP | 64-54749 | 3/1989 |
| JP | 07-312405 | 11/1995 |
| JP | 08-125066 | 5/1996 |
| JP | 08-306853 | 11/1996 |
| JP | 09-8205 | 1/1997 |
| JP | 09-8206 | 1/1997 |
| JP | 09-8207 | 1/1997 |
| JP | 09-92775 | 4/1997 |
| KR | 92-10286 A | 6/1992 |
| KR | 92-10286 B | 11/1992 |
| KR | 96-9774 A | 3/1996 |
| KR | 96-9774 B | 7/1996 |

*Primary Examiner*—Jack Chen
*Assistant Examiner*—Nema Berezny
(74) *Attorney, Agent, or Firm*—Stetina Brunda Garred & Brucker

(57) ABSTRACT

A semiconductor package is disclosed that comprises a chip paddle and a semiconductor chip that has a plurality of bond pads. The semiconductor chip is located on an upper surface of the chip paddle. Leads are formed at intervals along the perimeter of the chip paddle. The leads are in electrical communication with the bond pads. The semiconductor chip, the chip paddle and the leads are encapsulated by an encapsulation material. The height of the semiconductor package of the invention is minimized by half etching the chip paddle to reduce the thickness of the chip paddle such that the thickness of the chip paddle is less than the thickness of the leads. Preferably, the chip paddle of the present invention is about 25–75% of the thickness of the leads.

20 Claims, 3 Drawing Sheets

U.S. PATENT DOCUMENTS

| | | | |
|---|---|---|---|
| 5,894,108 A | 4/1999 | Mostafazadeh et al. | 174/52.4 |
| 5,977,613 A | 11/1999 | Takata et al. | 257/666 |
| 5,977,630 A | 11/1999 | Woodworth et al. | 257/712 |
| 6,081,029 A * | 6/2000 | Yamaguchi | 257/718 |
| 6,143,981 A | 11/2000 | Glenn | 174/52.4 |
| 6,194,777 B1 * | 2/2001 | Abbott et al. | 257/666 |
| 6,201,292 B1 * | 3/2001 | Yagi et al. | 257/666 |
| 6,229,200 B1 | 5/2001 | Mclellan et al. | 257/666 |
| 6,242,281 B1 | 6/2001 | Mclellan et al. | 438/106 |
| 6,294,100 B1 | 9/2001 | Fan et al. | 216/14 |
| 6,355,502 B1 | 3/2002 | Kang et al. | 438/110 |

* cited by examiner

SEMICONDUCTOR PACKAGE HAVING REDUCED THICKNESS

BACKGROUND OF THE INVENTION

1. Field of the Invention

The present invention relates to a semiconductor package and, more particularly, but not by way of limitation, to a semiconductor package that has a reduced thickness.

2. History of Related Art

It is conventional in the electronic industry to encapsulate one or more semiconductor devices, such as integrated circuit dies, or chips, in a semiconductor package. These plastic packages protect a chip from environmental hazards, and provide a method and apparatus for electrically and mechanically attaching the chip to an intended device. Recently, such semiconductor packages have included metal leadframes for supporting an integrated circuit chip which is bonded to a chip paddle region formed centrally therein. Bond wires which electrically connect pads on the integrated circuit chip to individual leads of the leadframe are then incorporated. A hard plastic encapsulating material, or encapsulant, which covers the bond wire, the integrated circuit chip and other components, forms the exterior of the package. A primary focus in this design is to provide the chip with adequate protection from the external environment in a reliable and effective manner.

As set forth above, the semiconductor package therein described incorporates a leadframe as the central supporting structure of such a package. A portion of the leadframe completely surrounded by the plastic encapsulant is internal to the package. Portions of the leadframe extend internally from the package and are then used to connect the package externally. More information relative to leadframe technology may be found in Chapter 8 of the book *Micro Electronics Packaging Handbook*, (1989), edited by R. Tummala and E. Rymaszewski. This book is published by Van Nostrand Reinhold, 115 Fifth Avenue, New York, N.Y., which is herein incorporated by reference.

Once the integrated circuit chips have been produced and encapsulated in semiconductor packages described above, they may be used in a wide variety of electronic appliances. The variety of electronic devices utilizing semiconductor packages has grown dramatically in recent years. These devices include cellular phones, portable computers, etc. Each of these devices typically include a motherboard on which a significant number of such semiconductor packages are secured to provide multiple electronic functions. These electronic appliances are typically manufactured in reduced sizes and at reduced costs, which has resulted in increased consumer demand. Accordingly, not only are semiconductor chips highly integrated, but also semiconductor packages are highly miniaturized with an increased level of package mounting density.

According to such miniaturization tendency, semiconductor packages, which transmit electrical signals from semiconductor chips to motherboards and support the semiconductor chips on the motherboards, have been designed to have a size of about 1×1 mm to 10×10 mm.

One obstacle to reducing the thickness of conventional semiconductor packages is the internal leads are as thick as the chip paddle. Under the condition that the thickness of the internal leads is identical to that of the chip paddle, the bond pads on the semiconductor chip that is mounted onto the chip paddle are positioned at a far higher level than are the internal leads, so that the loop height of the conductive wires for connecting the semiconductor chip and the internal leads is elevated. The loop height results in an increase in a wire sweeping phenomenon that is caused by pressure of an encapsulation material during encapsulation of the package components.

Previously, techniques for reducing the thickness of semiconductor packages have been utilized, such as back-grinding techniques in which a semiconductor chip is ground down before being mounted on a chip paddle. The back-grinding process, however, deleteriously affects the semiconductor chip. For example, a semiconductor chip that is thinned in this manner is apt to undergo warping, which may result in damaging the internal integrated circuits. In addition, the semiconductor chip itself may be cracked during the back-grinding.

BRIEF SUMMARY OF THE INVENTION

The various embodiments of the present invention provide a semiconductor package that is extremely thin without the need for conducting a back-grinding process or at least for reducing the amount of back-grinding that is required. In one embodiment of the present invention, there is provided a semiconductor package comprising a semiconductor chip provided with a plurality of bond pads, a chip paddle bonded to the bottom surface of the semiconductor chip via an adhesive, a plurality of leads formed at regular intervals along the perimeter of the chip paddle and conductive wires for electrically connecting the bond pads of the semiconductor chip to the leads. A package body comprises the semiconductor chip, the conductive wires, the chip paddle and the leads that are preferably encapsulated by an encapsulation material. The chip paddle, the leads and the tie bars are externally exposed at their side surfaces and bottom surfaces. The chip paddle is half-etched over the entire upper surface of the chip paddle, which results in a thinner thickness than the leads. In one embodiment of the present invention, the half-etched chip paddle is about 25–75% as thick as the leads. Accordingly, by half-etching the entire upper surface of the chip paddle, the chip paddle itself is made thinner than the leads, leading to the slimming of the semiconductor package.

BRIEF DESCRIPTION OF THE DRAWINGS

A more complete understanding of the method and apparatus of the present invention may be obtained by reference to the following detailed description, with like reference numerals denoting like elements, when taken in conjunction with the accompanying drawings wherein.

The present invention may be understood more readily by reference to the following detailed description of preferred embodiments of the present invention and the figures.

DETAILED DESCRIPTION OF THE INVENTION

Figure 1:
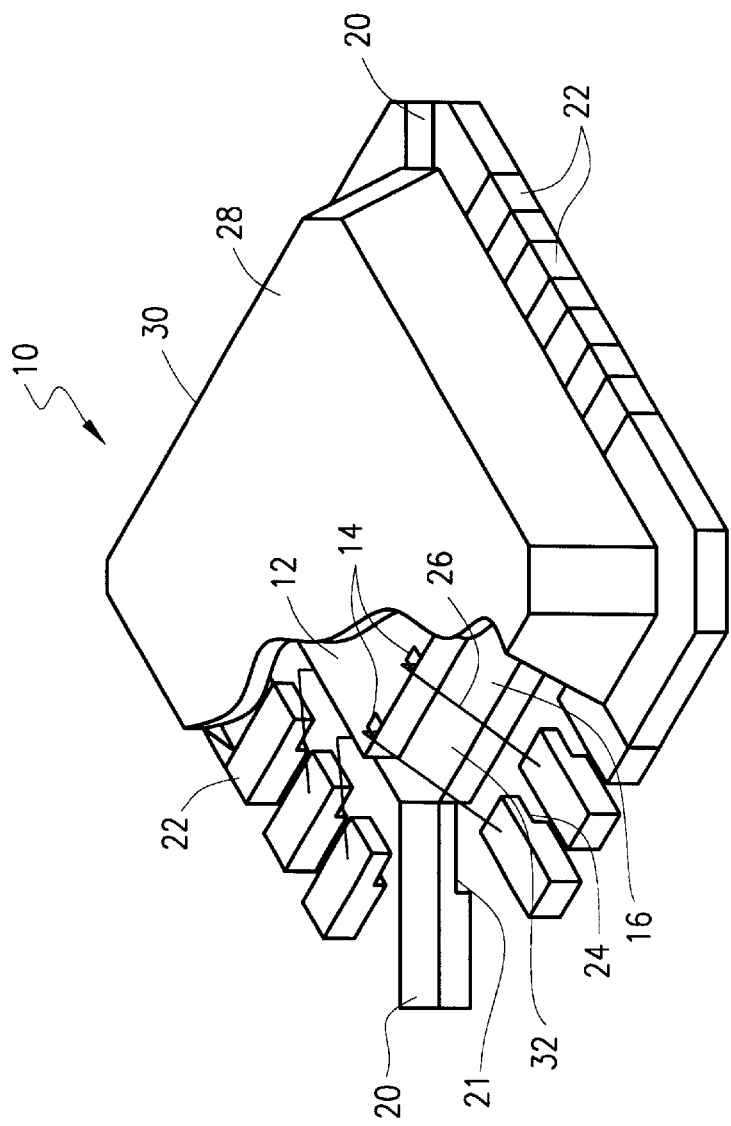
FIG. 1 is a cutaway perspective view of a semiconductor package incorporating the improved leadframe assembly of the present invention.
Figure 2:
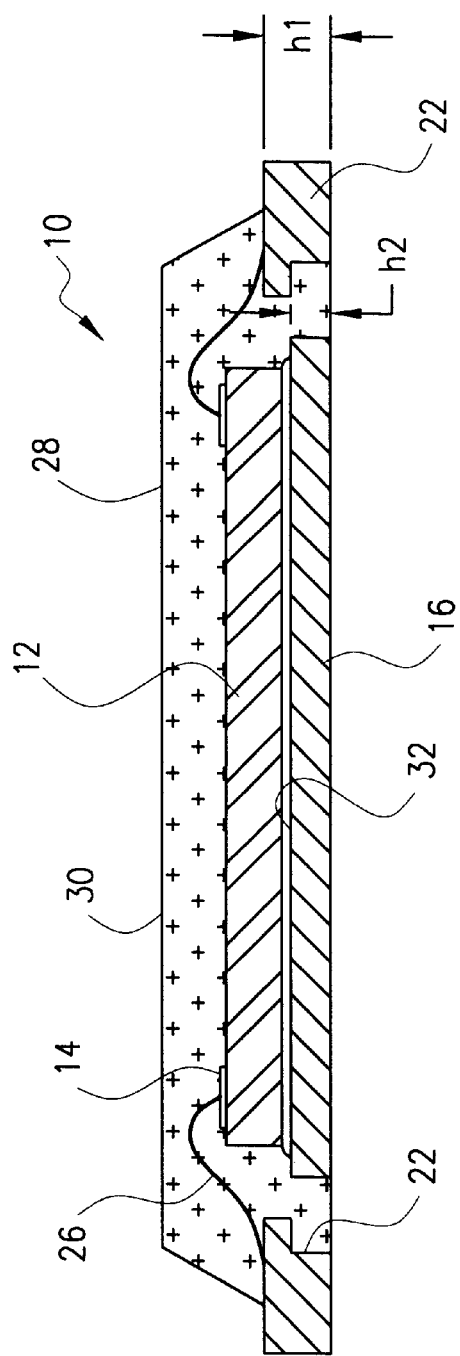
FIG. 2 shows a cross section of a semiconductor package wherein the semiconductor package has a chip paddle of reduced thickness according to one embodiment of the present invention.
Figure 3:
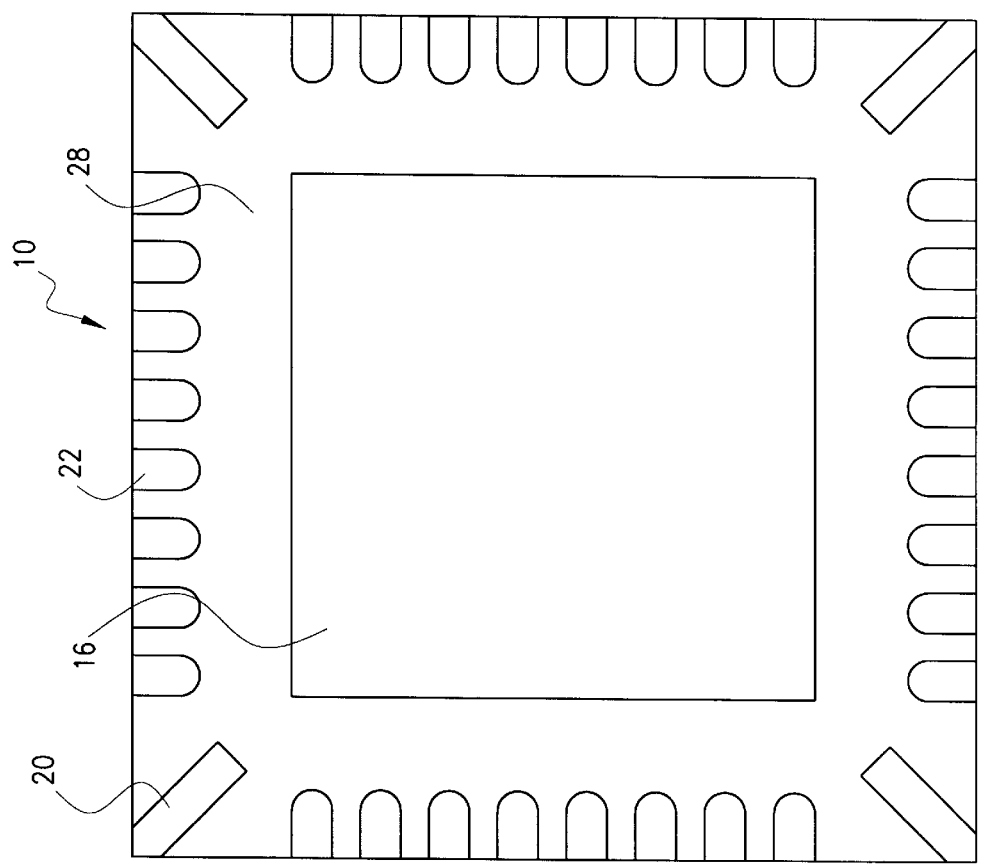
FIG. 3 shows a bottom plan view of the semiconductor package of FIG. 1.

Referring now to FIGS. 1, 2 and 3, a representative semiconductor package embodying aspects of the present invention is designated generally 10. Semiconductor package 10 comprises a semiconductor chip 12. Semiconductor chip 12 has a plurality of bond pads 14 on an upper surface of semiconductor chip 12 and along the perimeter of semiconductor chip 12. A chip paddle 16 is bonded to a bottom surface of semiconductor chip 12 via an adhesive. At a corner of chip paddle 16 is a tie bar 20 (FIGS. 1 & 2), which extends outwards toward a respective corner of the semiconductor package 10. Tie bar 20 preferably also has a half-etched portion 21 (FIG. 1).

A plurality of leads 22 are located along the circumference of chip paddle 16. The chip paddle 16 and the leads 22 are externally exposed at their bottom surfaces (see FIG. 2). Additionally, the leads 22 are exposed on their side faces (see FIG. 1). The externally exposed portions of the chip paddle 16 and the leads 22 may be electroplated with a corrosion-minimizing material such as, but not limited to, tin lead, tin, gold, nickel, nickel palladium, tin bismuth, or other similar materials known in the art. Each of leads 22 has a half-etched portion 24 at an end facing the chip paddle 16. The upper surface of each of leads 22 may also be electroplated with an electrical conductivity enhancing material such as, for example, gold or silver. Conductive wires 26 provide an electrical pathway between the bond pads 14 of the semiconductor chip 12 and the leads 22. The semiconductor chip 12, the conductive wires 26, the chip paddle 16 and the leads 22 are encapsulated by an encapsulation material 28 to create a package body 30 whereas the chip paddle 16, the leads 22 and the tie bars 20 are externally exposed toward the downward direction of the semiconductor package 10. The encapsulation material 28 may be thermoplastics or thermoset resins, with the thermoset resins including silicones, phenolics, and epoxies.

An aspect of the various embodiments of the present invention resides in the formation of a half etched surface 32 over the entire upper surface of the chip paddle 16, so as to make the thickness of the chip paddle 16, designated h2 (FIG. 2), smaller than the thickness of the internal lead 22, which is designated h1 (FIG. 2). Preferably, the chip paddle 16 is about 25–75% as thick as the leads 22, but this range is presented for example only and should not be construed to limit the present invention.

It is also preferred that the formation of the half-etched surface 32 over the entire upper surface of the chip paddle 16 is conducted while a lower side area of the internal lead 22 is etched, e.g., to form half etched portion 24. However, the present invention is not limited to etching the top surface of chip paddle 16 and the half etched portion 24 of the leads 22 may be formed simultaneously.

By half-etching the entire upper surface of the chip paddle 16, the total height of the semiconductor package body 30 is reduced. When semiconductor chip 12 is mounted on the half-etched surface 32 of the chip paddle 16, the semiconductor chip 12 is positioned at lower height than the semiconductor chip 12 would be if it were located on a non-etched chip paddle 16. Thus, the loop height of the conductive wires 26 is also lowered. An additional benefit is that the lower loop height of the conductive wires 26 decreases an occurrence of wire sweeping during encapsulation of the semiconductor package 10. Further, the low height of the semiconductor chip 12 results in decreasing the thickness of the semiconductor package 10.

The present invention has been described in an illustrative manner, and it is to be understood that the terminology used is intended to be in the nature of descriptions rather than of limitation. Many modifications and variations of the present invention are possible in light of the above teachings.

As described hereinbefore, the chip paddle 16 is made thinner than the leads 22 by half-etching the entire upper surface of the chip paddle 16, so that the total thickness of the semiconductor package 10 can be decreased. In addition, the height of semiconductor chip 12 with respect to the bottom surface of chip paddle 16 is reduced when the semiconductor chip 12 is mounted on the half-etched chip paddle 16. Consequently, the loop height of the conductive wires 26 is also lowered, which reduces wire sweeping during the encapsulation of the semiconductor package.

The following applications are all being filed on the same date as the present application and all are incorporated by reference as if wholly rewritten entirely herein, including any additional matter incorporated by reference therein:

| Docket No. | Title of Application | First Named Inventor |
| --- | --- | --- |
| 45475-00013 | Improved Thin and Heat Radiant Semiconductor Package and Method for Manufacturing | Jae Hun Ku |
| 45475-00014 | Leadframe for Semiconductor Package and Mold for Molding the Same | Young Suk Chung |
| 45475-00017 | Method for Making a Semiconductor Package Having Improved Defect Testing and Increased Production Yield | Tae Heon Lee |
| 45475-00018 | Near Chip Size Semiconductor Package | Sean Timothy Crowley |
| 45475-00022 | End Grid Array Semiconductor Package | Jae Hun Ku |
| 45475-00026 | Leadframe and Semiconductor Package with Improved Solder Joint Strength | Tae Heon Lee |
| 45475-00029 | Semiconductor Package Leadframe Assembly and Method of Manufacture | Young Suk Chung |
| 45475-00030 | Improved Method for Making Semiconductor Packages | Young Suk Chung |

It is thus believed that the operation and construction of the present invention will be apparent from the foregoing description of the preferred exemplary embodiments. It will be obvious to a person of ordinary skill in the art that various changes and modifications may be made herein without departing from the spirit and the scope of the invention.

What is claimed is:

1. A semiconductor package, comprising:
    a leadframe comprising:
        a die paddle defining opposed, generally planar top and bottom surfaces and having a paddle thickness between the top and bottom surfaces thereof;
        a plurality of leads extending at least partially about the die paddle in spaced relation thereto, each of the leads having:
            opposed, generally planar upper and lower lead surfaces and a lead thickness between the upper and lower lead surfaces thereof;
            an inner lead end; and
            a half-etched portion formed within the lower lead surface and extending to the inner lead end, the half-etched portion defining a generally planar etched lead surface which is disposed in opposed relation to the upper lead surface;
    a semiconductor chip attached to the top surface of the die paddle and electrically connected to at least one of the leads; and
    an encapsulation material at least partially encapsulating the leadframe and the semiconductor chip such that the lower surfaces of the leads are exposed within the encapsulation material;

the leadframe being formed in the manner wherein the lead thickness of each of the leads exceeds the paddle thickness such that the top surface of the die paddle extends in generally co-planar relation to the etched lead surface of each of the leads.

2. The semiconductor package of claim 1 wherein the semiconductor chip is electrically connected to the upper lead surface of the at least one of the leads via a conductive wire which is encapsulated by the encapsulation material.

3. The semiconductor package of claim 1 wherein the bottom surface of the die paddle is exposed within the encapsulation material and extends in generally co-planar relation to the lower lead surfaces of the leads.

4. The semiconductor package of claim 3 wherein the bottom surface of the, die paddle and the lower lead surfaces of the leads are each plated with a corrosion-minimizing material.

5. The semiconductor package of claim 1 wherein portions of the upper lead surfaces of each of the leads are exposed within the encapsulation material.

6. The semiconductor package of claim 1 wherein the leadframe further includes at least one tie bar attached to and extending from the die paddle, the tie bar having:

opposed, generally planar upper and lower tie bar surfaces; and a half-etched portion formed in the lower tie bar surface and defining an etched tie bar surface which is disposed in opposed relation to the upper tie bar surface.

7. The semiconductor package of claim 6 wherein:

the tie bar and each of the leads each further have an outer end; and the outer ends and portions of the upper lead and tie bar surfaces are exposed within the encapsulation material.

8. The semiconductor package of claim 6 wherein the lower tie bar surface is exposed within the encapsulation material and extends in generally co-planar relation to the lower lead surfaces of the leads.

9. The semiconductor package of claim 8 wherein the bottom surface of the die paddle is exposed within the encapsulation material and extends in generally co-planar relation to the lower lead and tie bar surfaces.

10. The semiconductor package of claim 9 wherein the bottom surface of the die paddle and the lower lead and tie bar surfaces are each plated with a corrosion-minimizing material.

11. The semiconductor package of claim 6 wherein the etched tie bar surface extends in generally co-planar relation to the etched lead surface of each of the leads.

12. The semiconductor package of claim 1 wherein the die paddle thickness is in the range of from about 25% to about 75% of the lead thickness of each of the leads.

13. The semiconductor package of claim 1 wherein the upper lead surface of the at least one of the leads is plated with an electrical conductivity enhancing material.

14. The semiconductor package of claim 1 wherein the semiconductor chip is secured to the top surface of the die paddle via an adhesive.

15. A leadframe comprising:

a die paddle defining opposed, generally planar top and bottom surfaces and having a paddle thickness between the top and bottom surfaces thereof; and a plurality of leads extending at least partially about the die paddle in spaced relation thereto, each of the leads having:

opposed, generally planar upper and lower lead surfaces and a lead thickness between the upper and lower lead surfaces thereof;

an inner lead end; and a half-etched portion formed within the lower lead surface and extending to the inner lead end, the half-etched portion defining a generally planar etched lead surface which is disposed in opposed relation to the upper lead surface;

the leadframe being formed in a manner wherein the lead thickness of each of the leads exceeds the paddle thickness such that the top surface of the die paddle extends in generally co-planar relation to the etched lead surface of each of the leads.

16. The leadframe of claim 15 wherein the bottom surface of the die paddle extends in generally co-planar relation to the lower lead surfaces of the leads.

17. The leadframe of claim 15 further including at least one tie bar attached to and extending from the die paddle, the tie bar having:

opposed, generally planar upper and lower tie bar surfaces; and a half-etched portion formed in the lower tie bar surface and defining an etched tie bar surface which is disposed in opposed relation to the upper tie bar surface.

18. The leadframe of claim 17 wherein the lower tie bar surface extends in generally co-planar relation to the lower lead surfaces of the leads.

19. The leadframe of claim 17 wherein the etched tie bar surface extends in generally co-planar relation to the etched lead surface of each of the leads.

20. The leadframe of claim 15 wherein the die paddle thickness is in the range of from about 25% to about 75% of the lead thickness of each of the leads.

* * * * *